United States Patent
Nguyen et al.

(10) Patent No.: US 9,991,868 B1
(45) Date of Patent: Jun. 5, 2018

(54) MICRO-RESONATOR HAVING LID-INTEGRATED ELECTRODE

(71) Applicant: HRL Laboratories, LLC, Malibu, CA (US)

(72) Inventors: Hung Nguyen, Los Angeles, CA (US); Raviv Perahia, Calabasas, CA (US); Lian X. Huang, Tarzana, CA (US); Srikanth Iyer, Los Angeles, CA (US)

(73) Assignee: HRL Laboratories, LLC, Malibu, CA (US)

(*) Notice: Subject to any disclaimer, the term of this patent is extended or adjusted under 35 U.S.C. 154(b) by 545 days.

(21) Appl. No.: 14/686,567

(22) Filed: Apr. 14, 2015

Related U.S. Application Data

(60) Provisional application No. 61/979,496, filed on Apr. 14, 2014.

(51) Int. Cl.
  *H03H 9/02* (2006.01)
  *H03H 9/24* (2006.01)
  *H03H 3/007* (2006.01)

(52) U.S. Cl.
  CPC ...... *H03H 9/02259* (2013.01); *H03H 3/0072* (2013.01); *H03H 9/2426* (2013.01); *B81B 2207/094* (2013.01); *H03H 9/2463* (2013.01)

(58) Field of Classification Search
  CPC ..... H03H 9/02259; H03H 2009/02283; H03H 9/2405; H03H 9/525; H03H 9/2463; H03H 3/0072; H03H 9/2426; B81B 2207/092; B81B 2207/095; B81B 2207/098
  USPC .......................................... 333/186; 257/415
  See application file for complete search history.

(56) References Cited

U.S. PATENT DOCUMENTS

| | | | |
|---|---|---|---|
| 6,153,917 A | 11/2000 | Matsunaga et al. | |
| 6,479,320 B1 | 11/2002 | Gooch | |
| 7,002,436 B2 * | 2/2006 | Ma | B81B 7/0077 333/186 |
| 7,104,129 B2 * | 9/2006 | Nasiri | B81C 1/0023 73/504.04 |
| 7,839,239 B2 * | 11/2010 | Sworowski | H03H 3/0076 310/309 |
| 8,567,247 B2 | 10/2013 | Shkel et al. | |

(Continued)

OTHER PUBLICATIONS

Kuan-Lin Chen, et al., Epitaxial Silicon Microshell Vacuum-Encapsulated CMOS-Compatible 200 MHz Bulk-Mode Resonator, IEEE MEMS 2009, pp. 23-26.

(Continued)

*Primary Examiner* — Robert J Pascal
*Assistant Examiner* — Jorge Salazar, Jr.
(74) *Attorney, Agent, or Firm* — North Shore Associates

(57) ABSTRACT

A micro-resonator employs a lid-integrated electrode to one or more of drive, sense and tune a vibrational resonant mode of a microelectromechanical systems (MEMS) resonator. The micro-resonator includes a lid attached to a base that provides a resonator cavity. The micro-resonator further includes the MEMS resonator extending from a surface of the base toward the lid within the resonator cavity. The lid-integrated electrode extends vertically from the lid into the resonator cavity toward the base. The vertically extending, lid-integrated electrode is positioned spaced from and adjacent to a side of the MEMS resonator to one or more of drive, sense and tune mechanical movement of the MEMS resonator.

22 Claims, 4 Drawing Sheets

(56) References Cited

U.S. PATENT DOCUMENTS

2015/0000401 A1   1/2015   Perahia et al.

OTHER PUBLICATIONS

Seiji Aoyagi and Yu-Chong Tai, Development of Surface Micromachinable Capactive Accelerometer Using Fringe Electrical Field, Transducers '03—IEEE, The 12th International Conference on Solid State Sensors, Actuators and Microsystems, Boston, Jun. 8-12, 2003, pp. 1383-1386.

L. D. Sorenson, et al., Effect of Thickness Anisotropy on Degenerate Modes in Oxide Micro-Hemispherical Shell Resonators, IEEE MEMS 2013, Taipei, Taiwan, Jan. 20 to 24, 2013, pp. 169-172.

Raviv Perahia, et al., Electric Gradient Force Drive Mechanism for Novel Micro-Scale All-Dielectric Gyroscope, IEEE MEMS 2014, San Francisco, CA, US, Jan. 26 to 30, 2014, pp. 721-724.

Deborah J. Kirby, et al., A Dielectric High Q MEMS Shell Gyroscope Structure, pending unpublished U.S. Appl. No. 14/024,506, filed Sep. 11, 2013, 25 pages plus 7 sheets of drawings.

\* cited by examiner

MICRO-RESONATOR HAVING LID-INTEGRATED ELECTRODE

CROSS-REFERENCE TO RELATED APPLICATIONS

This application claims priority from U.S. Provisional Patent Application Ser. No. 61/979,496, filed Apr. 14, 2014, the entire contents of which is incorporated herein by reference.

STATEMENT REGARDING FEDERALLY SPONSORED RESEARCH OR DEVELOPMENT

Background

1. Technical Field

The invention relates to microelectromechanical systems (MEMS). In particular, the invention relates to a MEMS resonator and electrodes used with the MEMS resonator.

2. Description of Related Art

Microelectromechanical (MEMS) resonators are microscale mechanical solid-state resonators produced or manufactured using MEMS technology. MEMS resonators show promise in a variety of areas including, but not limited to, signal filtering, mass sensing, motion sensing, and as timing references. For example, a particularly interesting potential application of MEMS resonators is as a vibrating structure gyroscopic sensor (e.g., Coriolis vibratory gyroscope) used to determine orientation and attitude of a device or system. MEMS vibrating structure gyroscopes may hold the promise of providing high precision, multi-axis, gyroscopic sensing using low cost devices that are packaged and directly integrated with other integrated circuit (IC) components of a system. However, while many advances have been made including, but not limited to, the use of high Q dielectric resonators, challenges still remain. Among the challenges facing MEMS resonators are providing efficient, high performance and cost effective drive and sense electrodes as well as providing packaging of the MEMS resonator and electrodes that maintains or enhances the performance of these MEMS devices (e.g., packaging that supports a vacuum environment).

BRIEF SUMMARY

In some embodiments, a micro-resonator having a lid-integrated electrode is provided. The micro-resonator comprises a resonator base and a resonator lid attached to the resonator base to provide an enclosed resonator cavity. The micro-resonator further comprises a microelectromechanical systems (MEMS) resonator supported by the resonator base. The MEMS resonator extends from a surface of the resonator base toward the resonator lid within the resonator cavity. The micro-resonator further comprises an electrode integrated into the resonator lid. The lid-integrated electrode extends vertically from a surface of the resonator lid into the resonator cavity toward the resonator base. The lid-integrated electrode is positioned adjacent to and spaced from a vertical side of the MEMS resonator. The lid-integrated electrode is configured to one or more of drive, sense and tune mechanical movement of the MEMS resonator.

In some embodiments, a micro-shell resonator system is provided. The micro-shell resonator system comprises a micro-shell resonator affixed to a substrate within a resonator cavity. The micro-shell resonator is configured to exhibit a vibrational resonant mode. The micro-shell resonator system further comprises an electrode integral to and extending vertically from a lid into the resonator cavity. The lid-integrated electrode is adjacent to and spaced from a sidewall of the micro-shell resonator. The lid-integrated electrode is configured to one or more of drive, sense and tune the vibrational resonant mode of the micro-shell resonator.

In some embodiments, a method of micro-resonator manufacturing is provided. The method of micro-resonator manufacturing comprises providing a resonator base having a micro-shell resonator that extends from a surface of the resonator base; and providing a resonator lid having electrodes integral with and extending vertically from a surface of the resonator lid. The method of micro-resonator manufacturing further comprises positioning the resonator lid with the resonator base to have the surface of the resonator lid facing the surface of the resonator base. The method of micro-resonator manufacturing further comprises affixing together the positioned resonator lid and base to enclose the micro-shell resonator in a resonator cavity formed by the positioned resonator lid and base.

BRIEF DESCRIPTION OF THE DRAWINGS

Various features of embodiments in accordance with the principles described herein may be more readily understood with reference to the following detailed description taken in conjunction with the accompanying drawings, where like reference numerals designate like structural elements, and in which.

Certain examples and embodiments have other features that are one of in addition to and in lieu of the features illustrated in the above-referenced figures. These and other features are detailed below with reference to the above-referenced figures.

DETAILED DESCRIPTION

Embodiments consistent with the principles of the present invention provide a micro-resonator with an electrode integrated into a lid of the micro-resonator. In particular, the electrode may be integrated into a lid positioned over a microelectromechnical systems (MEMS) resonator (e.g., a micro-shell resonator) in a vertical configuration. According to various embodiments, the vertical configuration of the lid-integrated electrode may facilitate achieving micro-resonator packaging having a compact form factor while simultaneously accommodating a relatively large number of (i.e., high density) electrodes for mechanisms including, but not limited to, one or more of driving, sensing and tuning of the micro-resonator. Further according to various embodiments, using the vertically configured, lid-integrated electrode may allow for enhancing, or in some embodiments, for maximizing, one or more of an applied driving force, a detection sensitivity, and tuning of the micro-resonator. The vertically configured, lid-integrated electrode may facilitate both wafer-scale integration and chip-scale integration of the electrodes with the MEMS resonator, for example. Moreover, a vacuum environment surrounding the MEMS resonator to facilitate performance (e.g., high quality or 'Q' factor) may be provided, according to various embodiments.

As used herein, the article 'a' is intended to have its ordinary meaning in the patent arts, namely 'one or more'. For example, 'an electrode' means one or more electrodes and as such, 'the electrode' means 'the electrode(s)' herein. Also, any reference herein to 'top', 'bottom', 'upper', 'lower', 'up', 'down', 'front', back', 'left', 'right', 'first' or 'second' is not intended to be a limitation herein. Herein, the term 'about' when applied to a value generally means within the tolerance range of the equipment used to produce the value, or in some examples, means plus or minus 20%, or plus or minus 10%, or plus or minus 5%, or plus or minus 1%, unless otherwise expressly specified. Further, the term 'substantially' as used herein means a majority, or almost all, or all, or an amount within a range of about 51% to about 100%, for example. Moreover, examples and embodiments herein are intended to be illustrative only and are presented for discussion purposes and not by way of limitation.

Figure 1A:
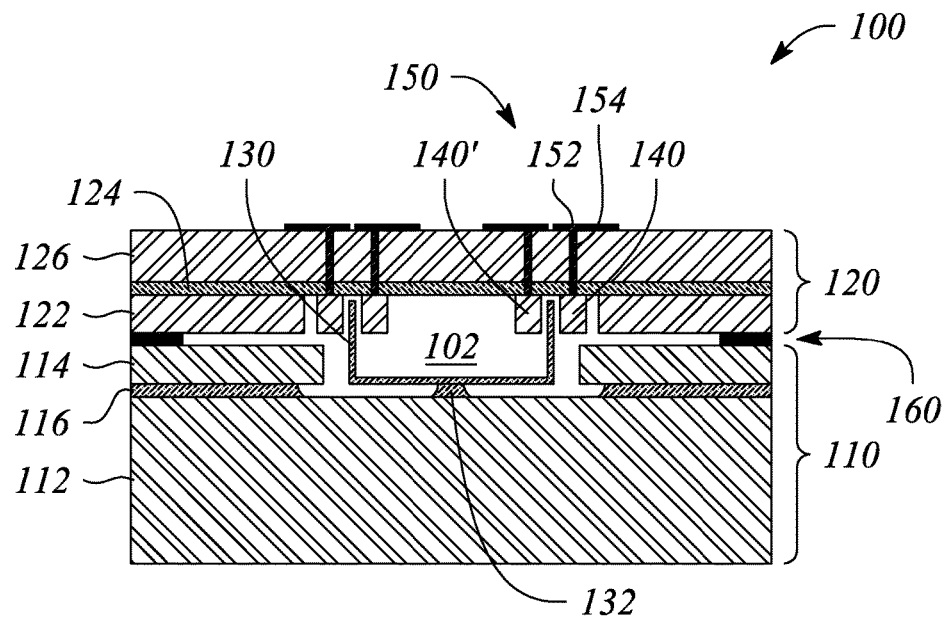
FIG. 1A illustrates a cross sectional view of a micro-resonator having a lid-integrated electrode in an example, according to an embodiment consistent with the principles of the present invention.
Figure 1B:
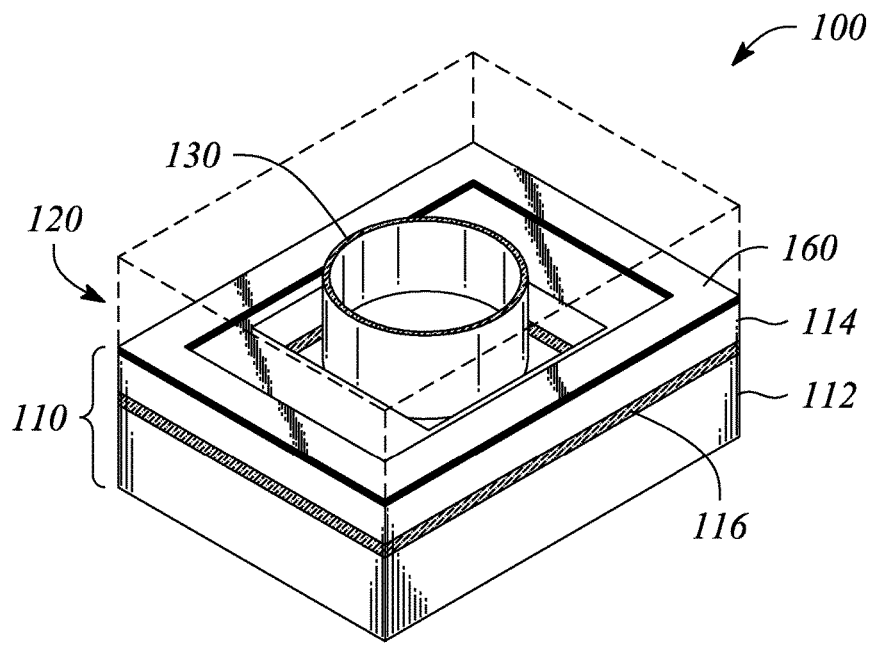
FIG. 1B illustrates a perspective view of the micro-resonator illustrated in FIG. 1A, according to an embodiment consistent with the principles of the present invention.

According to some embodiments of the present invention, a micro-resonator is provided. FIG. 1A illustrates a cross sectional view of a micro-resonator 100 having a lid-integrated electrode in an example, according to an embodiment consistent with the principles of the present invention. FIG. 1B illustrates a perspective view of a portion of the micro-resonator 100 illustrated in FIG. 1A in an example, according to an embodiment consistent with the principles of the present invention. The lid-integrated electrode is configured to one or more of drive, sense and tune a mechanical movement (e.g., a resonant vibrational mode) within the micro-resonator 100, according to various embodiments.

As illustrated in FIGS. 1A and 1B, the micro-resonator 100 comprises a micro-resonator base 110 that includes a microelectromechanical systems (MEMS) resonator 130 on a base substrate 112. The base substrate 112 may be a substantially planar substrate. The micro-resonator base 110 further includes a semiconductor layer on the base substrate 112 patterned into a base spacer 114 and a base portion of a micro-resonator cavity 102. The MEMS resonator 130 is located in the micro-resonator cavity 102 at least partially surrounded by the base spacer 114. In some examples, the base spacer 114 substantially surrounds the MEMS resonator 130. According to some embodiments, the micro-resonator base 110 may be formed from a semiconductor-on-insulator (SOI) wafer. The MEMS resonator 130 and the base spacer 114 on the base substrate 112 may be formed using wafer-scale manufacturing and MEMS fabrication techniques on the SOI wafer. The MEMS resonator 130 and the base spacer 114 are electrically isolated from one another and from the base substrate 112 by an insulator layer 116 of the SOI wafer, for example. In some examples, the semiconductor of the SOI wafer may include, but is not limited to, silicon (Si), silicon germanium (SiGe), or gallium arsenide (GaAs). Moreover, the insulator material (i.e., insulator layer 116) of the SOI wafer may include, but is not limited to, silicon dioxide ($SiO_2$), silicon nitride ($Si_3N_4$), a dielectric polymer or a dielectric resist material. For example, the SOI wafer may be a silicon-on-insulator wafer that includes a layer of Si on a layer of $SiO_2$. The MEMS resonator 130 is supported on the base substrate 112 by an anchor or pivot 132.

The micro-resonator 100 further comprises a micro-resonator cap or lid 120. As illustrated in FIG. 1A, the micro-resonator lid 120 comprises a planar support 126 and an electrode 140 integrated in the micro-resonator lid 120. The micro-resonator lid 120 may further comprise a lid spacer 122 spaced from and adjacent to the lid-integrated electrode 140, for example as illustrated in FIG. 1A. According to some embodiments, the micro-resonator lid 120 may comprise a semiconductor-on-insulator (SOI) wafer. The lid-integrated electrode 140, and the lid spacer 122 (if provided), may be formed using wafer-scale manufacturing and chip-scale integration on the SOI wafer. For example, a semiconductor layer of the micro-resonator lid 120 is patterned into the vertically extending, lid-integrated electrode 140. As illustrated in FIG. 1A, the semiconductor layer or another material deposited on the SOI wafer may be further patterned into the lid spacer 122. The lid spacer 122 may at least partially surround the lid-integrated electrode 140 and may form a lid portion of the micro-resonator cavity 102, in some examples. In other examples, the semiconductor layer is patterned into the vertically extending lid-integrated electrode 140 to be aligned with the base portion of the micro-resonator cavity 102 without the illustrated lid spacer 122. The lid-integrated electrode 140 is electrically isolated from other vertically extending lid-integrated electrodes 140, 140', and from the lid spacer 122 if provided (as illustrated in the example in FIG. 1A), by an insulator layer 124 of the SOI wafer, for example. Moreover, the lid-integrated electrode 140 extends vertically into the micro-resonator cavity 102 from the micro-resonator lid 120.

According to various embodiments, the micro-resonator lid 120 may comprise a material that is substantially similar to a material of the micro-resonator base 110. For example, the micro-resonator lid 120 may also comprise an SOI wafer that includes a semiconductor such as, but not limited to, Si, SiGe, or GaAs; and an insulator such as, but not limited to, $SiO_2$, $Si_3N_4$, a dielectric polymer or a dielectric resist material. In an example, the SOI wafer of the micro-resonator lid 120 may be a silicon-on-insulator wafer that includes a layer of Si and a layer of $SiO_2$.

As illustrated in FIG. 1A, the MEMS resonator 130 extends from the base substrate 112 in the base portion of the micro-resonator cavity 102 into the lid portion of the micro-resonator cavity 102. Moreover, the lid-integrated electrode 140 is positioned to vertically extend adjacent to and spaced from a vertical sidewall of the MEMS resonator 130 that extends into the lid portion of the micro-resonator cavity 102. FIG. 1A illustrates the lid-integrated electrode 140 externally positioned adjacent to and spaced from the vertical sidewall of the MEMS resonator 130. In some embodiments of the micro-resonator 100, e.g., as illustrated in FIGS. 1A-1B, the MEMS resonator 130 is a micro-shell resonator that is a hollow cylindrical shape having an open end opposite to an end thereof that is supported by the anchor 132 on the resonator base 110. The open end extends into the lid portion of the micro-resonator cavity 102. The MEMS resonator 130 may have other shapes and is further described below.

Further, as illustrated in FIG. 1A, in some embodiments, the micro-resonator lid 120 further comprises another lid-integrated electrode 140' that extends from the resonator lid 120 vertically into the lid portion of the micro-resonator cavity 102. In these embodiments, the other lid-integrated electrode 140' is internally positioned adjacent to and spaced from the vertical sidewall of the MEMS resonator 130 and may be opposite to the externally positioned lid-integrated electrode 140. The internal-positioned or 'inner' electrode 140' may be fabricated in the same way as the external-positioned or 'outer' electrode 140 during wafer-scale manufacturing, for example, and using wafer materials of the micro-resonator lid 120.

It is within the scope of some embodiments for the lid-integrated electrode to be an electrode pair 140, 140' that includes the inner electrode 140' and the outer electrode 140 positioned on either side of the vertical sidewall of the MEMS resonator 130, e.g., an opposing inner-outer electrode pair 140, 140', as described below. Although not illustrated, it is also within the scope of some embodiments herein for the micro-resonator 100 to include the lid-integrated inner electrode 140' instead of the outer electrode 140. In FIG. 1B, the micro-resonator lid 120 is not illustrated, but instead is represented by a dashed outline indicating a position of the micro-resonator lid 120 on the resonator base 110 of the micro-resonator 100.

According to various embodiments, the micro-resonator lid 120 further comprises an interconnect 150 that extend through the micro-resonator lid 120. The interconnect 150 includes circuitry that provides an isolated, internal electrical connection from the respective lid-integrated electrode 140, 140' to an electrically conductive contact pad 152 on an external surface of the micro-resonator lid 120. The interconnect 150 comprises the contact pad 152 comprising an electrically conductive material and a via or a feed-through 154 filled with an electrically conductive material to provide the isolated electrical connection to the respective lid-integrated electrode 140, 140'. In some examples, the electrically conductive material is also configured to provide a tight seal with the material of the micro-resonator lid 120 to support subsequent vacuum sealing of the micro-resonator cavity 102. For example, the materials may have one or both of compatible thermal expansion coefficients and compatible lattice matching to accommodate any physical stresses on the sealed micro-resonator 100. The electrically conductive materials for the contact pad 152 and the via 154 independently include, but are not limited to, one or more of polysilicon, doped polysilicon, another doped semiconductor material, and a conductive metal.

In some embodiments, the interconnect 150 may be fabricated during wafer-scale manufacturing of the micro-resonator lid 120 and using chip-scale integration to provide externally accessible integral interconnections to the respective lid-integrated electrodes 140, 140'. In some examples, the location of the interconnect 150 through the micro-resonator lid 120 and its position relative to the respective lid-integrated electrode 140, 140' provide a shorter path length (i.e., through the thickness of the resonator lid). As such, the interconnect 150 may have less parasitic capacitance and impedance of the conduction path, for example relative to a separate drive-sense device or a tuning device with electrodes attached to a resonator substrate next to the resonator.

According to various embodiments, the micro-resonator 100 further comprises an attachment member or seal 160 located between the micro-resonator lid 120 and the micro-resonator base 110. The attachment member 160 is configured to join the micro-resonator lid 120 and the micro-resonator base 110 together such that the micro-resonator cavity 102 is fully enclosed. In some embodiments, the attachment member 160 is a layer of attachment material on either the micro-resonator lid 120 or the micro-resonator base 110. In some embodiments, the attachment member 160 includes both a lid attachment layer and a base attachment layer that are mated together. In some embodiments, the attachment member or seal 160 is continuous, for example at an edge of the micro-resonator 100, to seal the MEMS resonator 130 from an external environment. Sealing of the micro-resonator 100 is further described below. Examples of attachment materials used for the attachment member 160 include, but are not limited to, one or more of an adhesive, a solder, and a eutectic alloy.

According to various embodiments, the MEMS resonator 130 may be substantially any mechanical resonator that is configured to vibrate or move. In particular, by definition, the MEMS resonator 130 is a mechanical resonator that is configured to move or vibrate within the micro-resonator cavity 102. According to some embodiments, the movement or vibration is or represents a vibrational resonator mode of the MEMS resonator 130. In various examples, the MEMS resonator 130 may be substantially any mechanical resonator that exhibits a vibrational resonance or a vibrational resonance mode. For example, the MEMS resonator 130 may comprise a proof mass attached to a spring anchor. The proof mass and spring may be a cantilever beam, for example.

According to some embodiments, the MEMS resonator 130 may be a dielectric resonator. For example, the MEMS resonator 130 may comprise a substantially non-conductive dielectric material including, but not limited to, a semiconductor (e.g., silicon (Si)), an oxide (e.g., $SiO_2$), a nitride (e.g., $Si_3N_4$), a carbide (e.g., SiC), or different types of diamond. The dielectric resonator may be configured to move or be driven by dielectric forces applied to the MEMS resonator 130. In other examples, the MEMS resonator 130 may comprise an electrically conductive material and be configured to move or be driven by an electric field or an electrostatic force. For example, the MEMS resonator 130 may be constructed from a conductive metal, a doped semiconductor (e.g., doped Si), or a dielectric material (e.g., $SiO_2$) that is coated with an electrically conductive material such as, but not limited to, a layer of conductive metal. In yet another example, the MEMS resonator 130 may comprise a magnetic material and therefore be a magnetic resonator configured to move or be driven by a magnetic field or magnetic force. In some examples, the MEMS resonator 130 may be a piezoelectric resonator comprising a piezoelectric material.

According to various embodiments, the MEMS resonator 130 is a substantially non-planar or three-dimensional (3D) structure having a height (or vertical dimension), a length and a depth, or having a height (i.e., vertical dimension) and a diameter or a circumference. For example, the shape of the MEMS resonator 130 may include, but is not limited to, a hemispherical shape, a cylindrical shape or a polygonal shape. The polygonal shape and the cylindrical shape independently may include, but are not limited to, substantially straight walls or substantially tapered walls. Further, the MEMS resonator 130 may be hollow, solid (e.g., a solid disk), or partially hollow or partially solid and may be closed at opposite ends, open at one end and closed at an opposite base end (adjacent to the anchor 132), or open at one end and have spokes extending between a central hub and the walls of the resonator structure at the opposite base end. As such, the MEMS resonator 130 has a vertically extending side or sidewall between the opposite ends thereof, by definition herein. In some embodiments, the vertical height of the MEMS resonator 130, including a sidewall height and a height of the anchor 132, exceeds a height of the base portion of the micro-resonator cavity 102, as illustrated in FIGS. 1A-1B. In particular, the height of the MEMS resonator 130, including the anchor 132 height, is sufficient to extend into the lid portion of the micro-resonator cavity 102, adjacent to the respective lid-integrated electrode 140, 140', but not exceed an overall height of the micro-resonator cavity 102.

In other embodiments (not illustrated), the vertical height of the MEMS resonator 130, including a sidewall height and a height of the anchor 132, is less than a height of the base portion of the micro-resonator cavity 102. In particular, the height of the MEMS resonator 130, including the anchor 132 height, does not exceed the combined height (thickness) of the insulator layer 116 and the base spacer layer 114 of the micro-resonator base 110. In some of these embodiments, the respective lid-integrated electrode 140, 140' extends within the base portion of the micro-resonator cavity 102 adjacent to the sidewall of the MEMS resonator 130. These embodiments include eliminating the lid spacer 122 and contacting the base spacer 114 with the micro-resonator lid 120 (e.g., the lid insulator layer 124) by way of the attachment member 160, for example.

In some examples, the vertical height of the sidewalls of the MEMS resonator 130 may be greater than about one fourth (¼) of the width or diameter of the MEMS resonator 130, for example. In other examples, the vertical height of the sidewalls may be greater than about one third (⅓) of the MEMS resonator width or diameter, or greater than about one half (½) of the MEMS resonator width or diameter, or greater than the MEMS resonator width or diameter.

In some embodiments (e.g., as illustrated in FIGS. 1A-1B), the MEMS resonator 130 comprises a micro-shell resonator 130. By definition herein, a 'micro-shell' resonator 130 is a MEMS resonator 130 that comprises a substantially hollow structure with a relatively thin sidewall, e.g., a sidewall that is thin relative to other dimensions of the hollow structure. The substantially hollow micro-shell resonator 130 may include, but is not limited to, a sphere, a half-sphere, other spheroids, other half spheroids, a closed cylinder, or a cylinder that is open on one or both ends. For example, FIGS. 1A-1B illustrate the hollow micro-shell resonator 130 having a substantially cylindrical shape. In particular, the cylindrically shaped, micro-shell resonator 130 illustrated in FIGS. 1A-1B has an open end oriented toward the micro-resonator lid 120. Further, as illustrated in FIG. 1A, the cylindrically shaped, micro-shell resonator 130 is attached by the anchor 132 to the resonator substrate 112 at the base end, which is at least partially closed. Vibrational resonator modes of the cylindrically shaped, micro-shell resonator 130 may include, but are not limited to, a so-called 'wine-glass' mode, for example. In some examples, the micro-shell resonator 130 comprises a dielectric micro-shell resonator that is configured to be driven by dielectric forces from an electric gradient. In other examples, the micro-shell resonator 130 further comprises a conductive material such as, but not limited to, a conductive metal coating on the dielectric micro-shell structure.

According to some embodiments, the micro-shell resonator 130 is formed using MEMS fabrication techniques and wafer-scale manufacturing techniques using an SOI wafer. As mentioned above, the micro-resonator base 110 and the micro-resonator lid 120 also may be formed using wafer-scale manufacturing techniques and chip-scale integration. In some embodiments, the micro-shell resonator 130 as well as its fabrication is substantially similar to the resonant micro-shell structures described in co-pending U.S. Patent Application of Deborah J. Kirby, et al., "A Dielectric High Q MEMS Shell Gyroscope structure," application Ser. No. 14/024,506, incorporated herein by reference in its entirety. The micro-resonator base 110 with the incorporated MEMS resonator 130 and the micro-resonator lid 120 with the respective lid-integrated electrode 140, 140' may be assembled into the micro-resonator 100 using wafer bonding techniques.

In some embodiments, one or both of the lid-integrated outer electrode 140 and the lid-integrated inner electrode 140' is configured to one or both of drive and sense a mechanical movement (e.g., vibrational resonant mode) of the MEMS resonator 130. In some embodiments, one or both of the respective lid-integrated electrodes 140, 140' is configured to tune the MEMS resonator 130, e.g., to compensate for any asymmetry of the MEMS resonator 130. For example, the respective lid-integrated electrode 140, 140' may be biased to achieve mode matching wherein a mode frequency is adjusted or the MEMS resonator 130 is damped.

As described above, the MEMS resonator 130 extends from the substrate portion of the micro-resonator cavity 102 and in some examples, into the lid portion of the micro-resonator cavity 102. Further, the respective lid-integrated electrode 140, 140' is configured to extend vertically from the micro-resonator lid 120 toward the micro-resonator base 110 in the micro-resonator cavity 102 adjacent to the MEMS resonator 130. For example, the lid-integrated electrode 140 is positioned to vertically extend in the micro-resonator cavity 102 externally adjacent to the side of the MEMS resonator 130 (i.e., the outer electrode 140). In some examples, the lid-integrated electrode 140' is also positioned to vertically extend in the micro-resonator cavity 102, but extends internally adjacent to the side of the MEMS resonator 130 (i.e., the inner electrode 140'). As such, in addition to being integrated with the micro-resonator lid 120, the respective lid-integrated electrode 140, 140' protrudes from the micro-resonator lid 120 a sufficient vertical distance into the micro-resonator cavity 102 to be positioned spaced from and vertically adjacent to the MEMS resonator vertical side (or sidewall), according to various embodiments.

FIG. 1A illustrates both the vertical extension of each of the respective lid-integrated electrodes 140, 140' from the micro-resonator lid 120 and the vertical side-adjacent, spaced positioning of the respective lid-integrated electrodes 140, 140' next to the MEMS resonator 130. The vertical extension and the side-adjacent, spaced positioning of the respective lid-integrated electrodes 140, 140' facilitate control of one or both of drive and sense mechanical movement of the MEMS resonator 130, according to various embodiments. In some examples, the position and the spacing of the respective lid-integrated electrodes 140, 140' further facilitate tuning of the MEMs resonator 130 to compensate for any asymmetry of the MEMs resonator 130. The lid-integrated outer electrode 140 is distinguished from substantially planar or 'surface' electrodes (i.e., for any of drive, sense and tune mechanisms) above or below a resonator on one or both of a lid and a resonator substrate. Moreover, the lid-integrated outer electrode 140 is distinguished from one or both a drive-sense device and a tuning device having side-positioned electrodes that is attached adjacent to a resonator on a resonator substrate. Embodiments of the micro-resonator 100 that instead or in addition include the lid-integrated inner electrode 140' distinguishes from these other configurations as well and may have additional features.

In some examples, a distance or gap between the respective lid-integrated electrode 140, 140' and the MEMS resonator sidewall may be made relatively small and further, the gap distance may be precisely controlled by using electrodes integrated into the micro-resonator lid 120, as described according to the principles herein. A precisely controlled gap distance may enhance, and in some examples, may maximize one or more of a drive force, a sensing sensitivity and a tuning capability between the respective lid-integrated electrode 140, 140' and the MEMS resonator 130. In contrast, it may be difficult to one or both of achieve and control the relatively small spacing between a drive electrode, a sense electrode or a tuning electrode and a resonator when the electrodes are surface electrodes located above or below the resonator on one or both of the lid and the substrate, for example. Further, it may be difficult to control of the positioning and the gap distance of electrodes attached on a separate drive and sense device or a tuning device along a side of the resonator. The respective lid-integrated electrodes 140, 140' described herein may substantially overcome these difficulties and other difficulties in manufacturing a micro-resonator. According to various embodiments herein, the respective lid-integrated electrode 140, 140' is configured to generate one or more of an electric gradient force, an electrostatic force and a bias voltage on the MEMS resonator 130. Moreover, the respective lid-integrated electrode 140, 140' is configured to sense a capacitance change with respect to the MEMS resonator 130 moving in an electric field, for example.

According to some embodiments, the respective lid-integrated electrode 140, 140' may comprise a material of the micro-resonator lid 120. For example, the electrode may comprise a doped semiconductor of the semiconductor device layer of the SOI wafer of the micro-resonator lid 120. The respective lid-integrated electrode 140, 140' is made accessible external to the micro-resonator 100 by way of the above-described circuitry (e.g., the interconnect 150) integrated into the micro-resonator lid 120, according to some embodiments.

In some embodiments, opposing inner and outer lid-integrated electrodes 140, 140' may be configured as inner and outer electrode pairs 140, 140' to one or both of drive and sense the MEMS resonator movement in a push-pull relationship. For example, to drive movement of the micro-shell resonator 130 in a push-pull relationship, a voltage applied to an inner electrode 140' may be ninety degrees (90°) out of phase to a voltage applied to an opposing outer electrode 140. Using a push-pull relationship for one or both of driving movement and sensing movement may reduce, or in some examples may minimize, the voltage applied to drive the micro-shell resonator 130. Moreover, using a push-pull relationship for one or both of driving movement and sensing movement may increase, or in some examples may maximize, a sensitivity to movement of the micro-shell resonator 130, according to various embodiments. In some examples, the pair of opposing inner and outer lid-integrated electrodes 140, 140' may allow for differential capacitance measurements, for example to achieve common-mode noise rejection and reduction of parasitic capacitance.

In some embodiments, one or both of the outer lid-integrated electrode 140 and the inner lid-integrated electrode 140' may be a member of a plurality of the respective electrode, or the opposing inner and outer lid-integrated electrode pair 140, 140' may be a member of a plurality of such inner-outer lid-integrated electrode pairs. FIG. 1A illustrates two inner electrodes 140' and two outer electrodes 140 respectively positioned on either side of the illustrated micro-shell resonator 130, by way of example. In some embodiments, the plurality of the respective lid-integrated electrode 140, 140' or the plurality of opposing inner-outer electrode pairs 140, 140' may be distributed along or around the MEMS resonator 130. For example, the micro-resonator 100 may have a plurality of lid-integrated inner-outer electrode pairs 140, 140' distributed around a periphery of the micro-shell resonator 130 (e.g., around a periphery of the open-ended cylinder). A first set of opposing inner-outer electrode pairs 140, 140' of the respective plurality may be configured as drive electrodes. A second set of opposing inner-outer electrode pairs 140, 140' of the respective plurality may be configured as sense electrodes. Moreover, a third set of opposing inner-outer electrode pairs 140, 140' of the respective plurality may be configured as tuning electrodes, for example.

Figure 3:
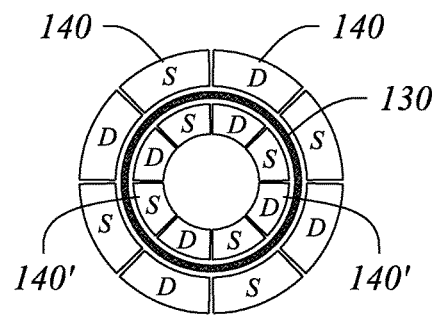
FIG. 3 illustrates a schematic view of interspersed drive and sense electrodes around a micro-shell resonator in an example, according to an embodiment consistent with the present invention.

According to some examples, the first and second sets of opposing inner-outer electrode pairs 140, 140' may be alternated around the MEMS resonator 130. For example, four opposing inner-outer electrode pairs 140, 140' in the first (or 'drive') set may be positioned about ninety degrees (90°) apart from one another around the interior and exterior periphery of the micro-shell resonator 130. Similarly, four opposing inner-outer electrode pairs 140, 140' in the second (or 'sense') set also may be positioned about 90° apart from one another around the interior and exterior periphery of the micro-shell resonator 130. In this example, the respective sense electrode pairs of the second set also may be interspersed around the micro-shell resonator 130 at about forty-five degrees (45°) from the respective drive electrode pairs of the first set. FIG. 3 illustrates a schematic view of interspersed drive and sense electrodes 140, 140' around a micro-shell resonator 130 in an example, according to an embodiment consistent with the present invention. The drive and sense electrodes 140, 140' illustrated in FIG. 3 are labeled 'D' and 'S', respectively.

In some embodiments (not illustrated in FIG. 3), the third or tuning set of opposing inner-outer electrode pairs 140, 140' may be interspersed with one or both of the drive electrode sets and the sense electrode sets. For example, four opposing inner-outer electrode pairs 140, 140' of the third or tuning set may be positioned about ninety degrees (90°) apart from one another around the interior and exterior periphery of the micro-shell resonator 130. Further, the respective tuning electrode pairs of the third set also may be interspersed around the micro-shell resonator 130 at about twenty-two degrees (22°) from the electrode pairs of the first set or the second set.

Moreover, it is within the scope of some embodiments for one or more of the drive ('D') electrodes or electrode pairs or one or more of the sense ('S') electrodes or electrode pairs of the opposing inner-outer electrodes 140, 140' illustrated in FIG. 3 to be configured as tuning electrodes or tuning electrode pairs instead of drive or sense electrodes or pairs. Alternatively, any of the respective electrodes in the first and second sets may be configured to provide tuning in addition to driving or sensing, and still be within the scope of the principles described herein. For example, in some embodiments, either the first set or the second set of opposing inner-outer electrode pairs 140, 140' may be configured to provide both drive and sense mechanisms, while the other of the first and second sets of opposing inner-outer electrode pairs 140, 140' may be configured to provide tuning.

Other respective sets of the plurality of inner-outer electrode pairs 140, 140' described above may include one or both of other drive and sense electrode sets 140, 140' and tune electrode sets 140, 140', for example. In other embodiments (not illustrated), the plurality of lid-integrated electrodes may be limited to alternating drive electrodes, sense electrodes and tuning electrodes positioned either external (electrodes 140) to the micro-shell resonator or internal (electrodes 140') to the micro-shell resonator. Moreover, it is within the scope of the principles herein for a plurality of the lid-integrated electrodes to be respectively vertically positioned side-adjacent to a MEMS resonator that is other than cylindrical in shape.

In some embodiments, one or both of the lid-integrated electrodes 140, 140' comprises an electric gradient force electrode. In particular, one or both of the lid-integrated electrodes 140, 140' may be configured to provide an electric gradient force to drive a dielectric MEMS resonator 130 (e.g., a dielectric micro-shell resonator 130) using dielectric forces. Similarly, one or both of the lid-integrated electrodes 140, 140' may be configured to sense motion of the dielectric MEMS resonator 130 (e.g., a dielectric micro-shell resonator 130) using an electric gradient force sense mode. An electric gradient force electrode may comprise a pair of adjacent lid-integrated electrodes (either adjacent outer electrodes 140 or adjacent inner electrodes 140') and an applied alternating current (AC) voltage configured to produce an AC electric field between the adjacent electrodes. In some examples, the adjacent lid-integrated electrodes are members of a set of interdigital electrodes.

Additional description of electric gradient force electrodes and the use of electric gradient force to drive and sense motion in a dielectric MEMS resonator is provided by co-pending U.S. Patent Application Publication No. 2015/0000401 A1 to Perahia et al., and Perahia et al., "Electric gradient force drive mechanism for novel micro-scale all-dielectric gyroscope," 2014 IEEE 27$^{th}$ Int. Conf. on Micro Electro Mechanical Systems (MEMS), 26-30 Jan. 2014, pp. 721-724, both of which are incorporated herein in their entirety. In other examples, another electrode configuration may be employed such as when the MEMS resonator 130 (e.g., a metal micro-shell resonator 130) is configured to be one or both of driven and sensed using capacitive electric fields, for example.

In some embodiments, instead of both of the micro-resonator base 110 and the micro-resonator lid 120 including the above-described respective spacers 114, 122, either the micro-resonator base 110 or the micro-resonator lid 120 may include a spacer at least to facilitate delineation of the micro-resonator cavity 102 and still be within the scope of the principles described herein. In particular, the cavity height of the micro-resonator cavity 102 of the micro-resonator 100 is configured to support the combined height of the MEMS resonator 130 and the anchor 132 without making physical contact with the micro-resonator lid 120. The cavity height provided by the respective spacer is sufficient to support an unencumbered combined height of the MEMS resonator 130 and the anchor 132 in the micro-resonator 100. In some examples, the spacer may be fabricated as a separate part that is subsequently affixed to one or both the micro-resonator base 110 and the micro-resonator lid 120. The respective spacers 114, 122 may further provide a stable bond area for affixing the micro-resonator lid 120 and the micro-resonator base 110 together. In some examples, the respective spacers 114, 122 further facilitate wafer bonding between the micro-resonator lid 120 and the micro-resonator base 110. The respective spacers 114, 122 may facilitate sealing the micro-resonator cavity 102 from the external environment, for example. A bond or seal 160 (i.e., using the attachment member 160) between the respective spacers 114, 122 is illustrated in FIGS. 1A-1B, by way of example and not limitation.

In some embodiments, the micro-resonator cavity 102 is configured to be hermetically sealed using the attachment member 160. In some embodiments, the hermetically sealed micro-resonator cavity 102 may be configured to provide vacuum encapsulation of the MEMS resonator 130. Vacuum encapsulation may facilitate the mechanical movement associated with a resonance of the MEMS resonator 130, for example.

Figure 2A:
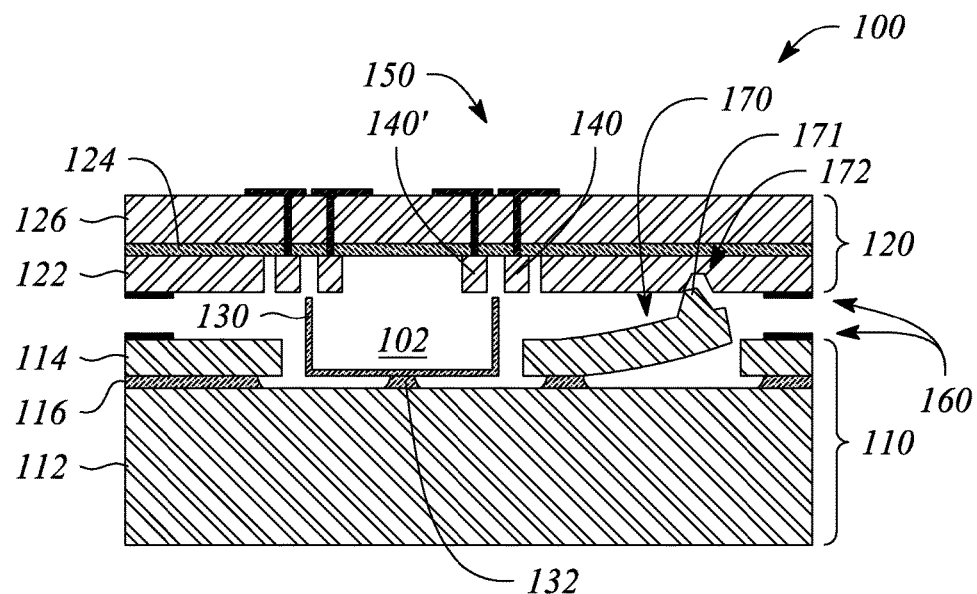
FIG. 2A illustrates a cross sectional view of a micro-resonator including an integral mechanical alignment system during alignment in an example, according to an embodiment consistent with the principles of the present invention.
Figure 2B:
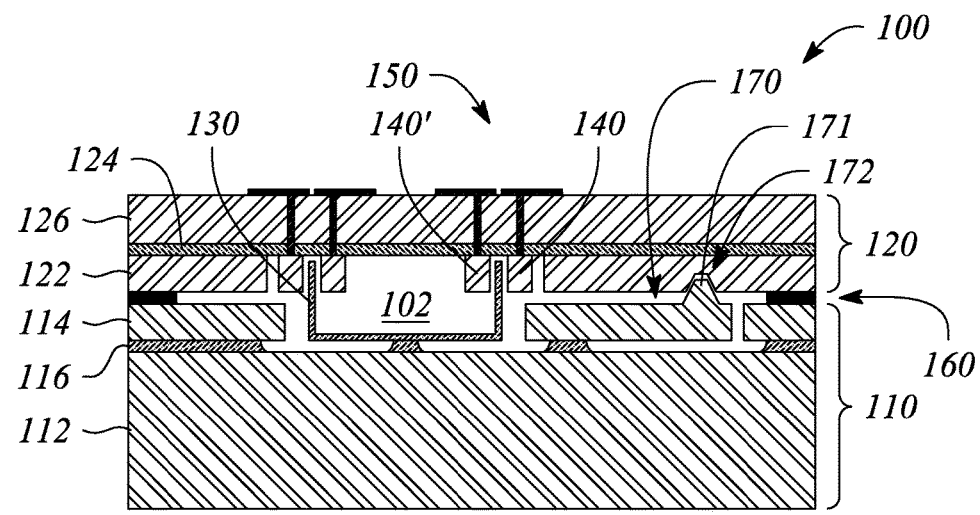
FIG. 2B illustrates a cross sectional view of the micro-resonator including the integral mechanical alignment system of FIG. 2A after alignment in an example, according to an embodiment consistent with the principles of the present invention.

According to some embodiments of the principles described herein, the micro-resonator 100 further comprises an integral mechanical alignment system. FIG. 2A illustrates a cross sectional view of a micro-resonator 100 including an integral mechanical alignment system 170 in an example, according to an embodiment consistent with the principles of the present invention. FIG. 2B illustrates a cross sectional view of the micro-resonator 100 including the integral mechanical alignment system 170 of FIG. 2A in another example, according to an embodiment consistent with the principles of the present invention. In particular, FIG. 2A illustrates the cross sectional view during alignment but prior to bonding of the micro-resonator lid 120 and the micro-resonator base 110, while FIG. 2B illustrates the cross sectional view after alignment and bonding, by way of example.

According to various embodiments, the integral mechanical alignment system 170 is configured to provide active mechanical alignment between the micro-resonator base 110 and the micro-resonator lid 120 during assembly (e.g., for wafer bonding). The provided active mechanical alignment is configured to establish a relative position of the respective lid-integrated electrode 140, 140' with respect to MEMS resonator 130 in the micro-resonator cavity 102. For example, the active mechanical alignment provided by the integral mechanical alignment system 170 enables one or both of positioning of the outer lid-integrated electrode 140 adjacent to the exterior side of the micro-shell resonator 130 and positioning the inner lid-integrated electrode 140' adjacent to the interior side of the micro-shell resonator. In the embodiments that include the opposing outer and inner electrode pair 140, 140', the active mechanical alignment provided by the integral mechanical alignment system 170 enables simultaneous positioning of the opposing lid-integrated electrodes 140, 140', for example.

Further, the provided active mechanical alignment may facilitate substantially accurate positioning of the respective lid-integrated electrode 140, 140' relative to the MEMS resonator 130. For example, a spacing between the respective inner electrode 140' and the respective outer electrode 140 of the opposing lid-integrated electrode pair as well as the gap distances between the respective inner and outer electrodes 140, 140' and the sidewall of the micro-shell resonator 130 may be relatively tight to facilitate drive and sense coupling between the respective lid-integrated electrodes 140, 140' and the micro-shell resonator 130. Moreover, assembly of the micro-resonator lid 120 and the micro-resonator base 110 together for bonding may prevent using visual observation of the lid-integrated electrodes 140, 140' and the micro-shell resonator 130 (i.e., it may be a blind assembly). The integral mechanical alignment system 170 is configured to provide active mechanical alignment during assembly including positioning the respective lid-integrated electrodes 140, 140' relative to the micro-shell resonator 130 that, in some examples, has substantially precise control of the respective gaps therebetween to substantially avoid damage, for example.

In some embodiments, the integral mechanical alignment system 170 comprises an alignment key 171 at an end of a cantilevered, pre-loaded beam and a corresponding alignment notch 172 configured to receive the alignment key 171, as illustrated in FIGS. 2A and 2B. By definition, the 'preloaded' beam is configured to provide an out-of-plane flex to the cantilevered beam relative to a plane of the micro-resonator lid 120 and a plane of the micro-resonator base 110, as illustrated in FIG. 2A. The out-of-plane flex of the cantilevered beam is configured to facilitate the active mechanical alignment during assembly of the micro-resonator 100. In particular, the out-of-plane flex of the cantilevered beam positions the alignment key 171 to a height that is greater than the combined height of the MEMS resonator 130 and the anchor 132 on the micro-resonator base 110 in some examples. The out-of-plane flex of the cantilevered beam is configured to enable engagement between the alignment key 171 and the corresponding alignment notch 172 prior to the point during assembly of the micro-resonator base 110 and the micro-resonator lid 120 when the lid-integrated electrodes 140, 140' and the micro-shell resonator 130 are positioned side-adjacent to one another. Moreover, once the alignment key 171 is engaged in the alignment notch 172, the mechanical alignment is to substantially control precise positioning of the lid-integrated electrodes 140, 140' with respect to the MEMS resonator 130 as the micro-resonator lid 120 and the micro-resonator base 110 are mated together for bonding.

Further, by 'active' mechanical alignment, it is meant that the pre-loaded beam is compressed (e.g., like a spring) into the respective plane of the micro-resonator base 110 and the micro-resonator lid 120 when the micro-resonator base and lid 110, 120 are mated together during alignment or assembly, for example, to be sealed together as illustrated in FIG. 2B. Further, 'active' mechanical alignment may further mean that surface tension between a surface of the alignment key 171 and a surface of the alignment notch 172 facilitates alignment of the micro-resonator base 110 and the micro-resonator lid 120. In some embodiments, the surfaces of the one or both of the alignment key 171 and the corresponding alignment notch 172 may be functionalized to facilitate surface attraction or enhance surface energy of the respective surfaces. In the embodiment illustrated in FIGS. 2A-2B, the pre-loaded beam alignment key 171 is integrally formed on the micro-resonator base 110 and the corresponding alignment notch 172 is integrally formed in the micro-resonator lid 120, by way of example and not limitation herein.

According to some embodiments, the pre-loaded beam of the alignment key 171 may comprise a first material (e.g., a semiconductor or an oxide). For example, the materials of the micro-resonator base 110 used to form the base spacer 114 or the MEMS resonator 130 may be used to form the cantilevered beam. Moreover, the pre-loaded beam of the alignment key 171 may be formed during wafer-scale manufacturing of the base SOI wafer using MEMS techniques, for example. To obtain the out-of-plane flex, in some examples, at least a surface of the cantilevered beam may be coated with a second material that has a thermal mismatch or a lattice mismatch to the first material sufficient to provide the stress of the out-of-plane flex of the pre-loaded beam. The mismatch stress may be sufficient to achieve the out-of-plane height to the alignment key 171 that exceeds the combined height of the MEMS resonator 130 and the anchor 132 (i.e., an alignment key clearance height).

For example, the cantilevered beam may be made from silicon (the first material) that is cantilevered from an insulator pivot material (e.g., substantially similar to the materials used to form the MEMS resonator 130 and the base spacer 114). One or both of the silicon and the insulator material may be materials of a base SOI wafer. Moreover, the silicon cantilevered beam may be at least partially surface coated with a eutectic material, for example during the application of a eutectic alloy material of the attachment member or seal 160 on the base spacer 114 of the micro-resonator base 110. Additionally, although not illustrated, the mechanical alignment system 170 may be fabricated during wafer-scale manufacturing using MEMS techniques, as described above, but located along edges of the respective micro-resonator lid and base wafers, i.e., outside of the seal 160 of the micro-resonator 100, and still facilitate the alignment described herein.

Other alignment arrangements and techniques may be used that are within the scope of the principles described herein. For example, a pre-loaded beam having the alignment key may be located on the micro-resonator lid 120 and the corresponding alignment notch may be located on the micro-resonator base 110. Moreover, in some examples, alternating alignment keys and corresponding alignment notches may be present on each of the micro-resonator lid 120 and the micro-resonator base 110. In other examples, the pre-loaded beam alignment key may have a height that is substantially the same height as the combined height of the MEMS resonator 130 and its anchor 132, and the integral mechanical alignment system 170 may further include another means for ensuring engagement of the alignment key in the corresponding alignment notch before the micro-resonator lid 120 and the micro-resonator base 110 make contact during assembly. In some examples, the integral arrangement of the electrodes and interconnection circuitry within the resonator lid as well as the integral mechanical alignment system described herein will facilitate a micro-resonator form factor reduction. The form factor reduction may facilitate reduced manufacturing costs, in particular, with an ability to increase a total number of micro-resonators that will fit in a specified wafer area.

Figure 4:
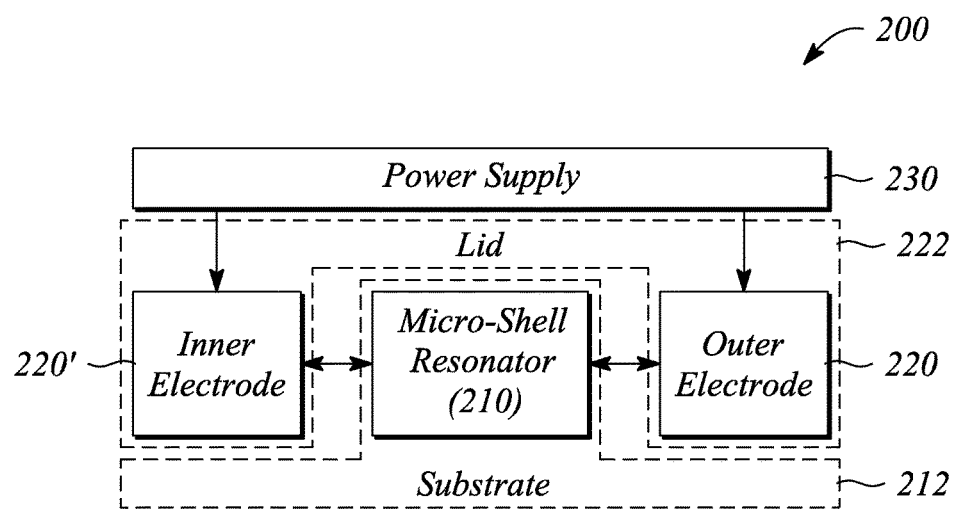
FIG. 4 illustrates a block diagram of a micro-shell resonator system in an example, according to an embodiment consistent with the present invention.

According to some embodiments of the present invention, a micro-shell resonator system is provided. FIG. 4 illustrates a block diagram of a micro-shell resonator system 200 in an example, according to an embodiment consistent with the present invention. As illustrated, the micro-shell resonator system 200 comprises a micro-shell resonator 210. According to various embodiments, the micro-shell resonator 210 is affixed to a substrate 212. For example, the micro-shell resonator 210 may be affixed to the substrate 212 at or by a support. The micro-shell resonator 210 is configured to exhibit a vibrational resonant mode. The micro-shell resonator system 200 further comprises a lid 222. A cavity formed by the substrate 212 and the lid 222 encloses the micro-shell resonator 210.

According to some embodiments, the micro-shell resonator 210 may be substantially similar to the micro-shell resonator 130 described above with respect to the micro-resonator 100. For example, the micro-shell resonator 210 may be a dielectric micro-shell resonator comprising a dielectric hollow cylinder having a closed first end and an open second end. Further, the support may affix the dielectric cylinder to the substrate 212 at the closed first end, while the open second end faces away from the substrate 212, for example, toward the lid 222.

According to various embodiments, the micro-shell resonator system 200 further comprises one or both of an outer electrode 220 and an inner electrode 220' integral to and extending vertically from the lid 222 into the cavity (i.e., towards the substrate 212). The lid 222 further comprises integral interconnection circuitry to provide electrical connection from an exterior surface of the lid 222 to the respective lid-integrated electrodes 220, 220'. According to various embodiments, the outer electrode 220 is positioned adjacent to and spaced from an outer surface of the micro-shell resonator 210. The inner electrode 220' extends from the lid 220 adjacent to and spaced from an inner surface of the micro-shell resonator 210, according to various embodiments. In some examples, the outer and inner electrodes 220, 220' comprise respective pairs of electrodes 220, 220'. The outer and inner electrodes 220, 220' are configured to one or more of drive, sense and tune the vibrational resonant mode of the micro-shell resonator 210, as illustrated in FIG. 4 by double-headed arrows.

According to some embodiments, the outer electrode 220 may be substantially similar to the outer lid-integrated electrode 140 of the micro-resonator 100, described above. Similarly, the inner electrode 220' may be substantially similar to the inner lid-integrated electrode 140', described above with respect to the micro-resonator 100, according to some embodiments. In some embodiments, the interconnection circuitry is substantially similar to the interconnect 150 described above with respect to the micro-resonator 100. Moreover, the respective pairs of electrodes 220, 220' may be substantially similar to the opposing inner-outer lid-integrated electrode pair 140, 140', described above with respect to the micro-resonator 100, according to some embodiments. For example, the outer electrode 220 and the inner electrode 220' in combination may be configured to both drive and sense the vibrational resonant mode in a push-pull arrangement using voltages applied by way of the interconnection circuitry to the respective electrodes 220, 220'. Further, the outer electrode 220 and the inner electrode 220' in combination may be configured to drive and sense the vibrational resonant mode according to or using electric gradient forces. Electric gradient forces may be used to one or both of drive and sense the vibrational resonant mode when the micro-shell resonator 210 is a dielectric micro-shell resonator, for example. Moreover, one or both of the inner electrode 220' and the outer electrode 220 may be a tuning electrode.

According to various embodiments of the micro-shell resonator system 200, the lid 222 and the substrate 212 are mated together for assembly to enclose the micro-shell resonator 210 within the resonator cavity. As such, the combination of the substrate 212 and the lid 222 is a housing or enclosure for the micro-shell resonator 210. In some embodiments, the lid 222, the substrate 212 and the micro-shell resonator 210 and their assembly are substantially similar to the various embodiments and examples of the micro-resonator 100, described above.

For example, the micro-shell resonator system 200 may further comprises a spacer between the lid 222 and the substrate 212. The spacer facilitates formation of the cavity that accommodates the micro-shell resonator 210. The spacer may include a bonding layer to provide a seal between the lid 220 and the substrate 212, for example. In some embodiments, the seal may facilitate maintaining a vacuum (or at least a substantial vacuum) within the cavity. According to some embodiments, the spacer may be substantially similar to one or both of the spacers 114, 122, described above with respect to the micro-resonator 100. Moreover, the bonding layer or seal may be substantially similar to the attachment member or seal 160, described above with respect to the micro-resonator 100, in some embodiments.

In addition, the micro-shell resonator system 200 may further comprise a mechanical alignment system. The mechanical alignment system is configured to provide active mechanical alignment between the substrate 212 and the lid 222 during assembly. In particular, the provided mechanical alignment is configured to establish a relative position of one or both of the outer electrode 220 and the inner electrode 220' with respect to micro-shell resonator 210.

According to some embodiments, the mechanical alignment system is substantially similar to the integral mechanical alignment system 170 of the micro-resonator 100, described above. In particular, the mechanical alignment system may comprise an alignment key on an end of a cantilevered, pre-loaded beam integral with one of the substrate 212 and the lid 222 and a corresponding alignment notch integral with a respective other of the substrate 212 and the lid 222. The alignment notch is configured to accept or engage with the alignment key. The pre-loaded beam is configured to provide an out-of-plane flex relative to the plane of the substrate 212 and the lid 222. An engagement of the alignment key in the alignment notch is configured to facilitate active mechanical alignment during assembly, according to various embodiments.

As illustrated in FIG. 4, the micro-shell resonator system 200 may further comprise a power supply 230, according to some embodiments. The power supply 230 is configured to provide a drive voltage to one or both of the outer electrode 220 and the inner electrode 220'. The drive voltage may be an alternating current (AC) voltage, for example. In some embodiments that include both inner and outer electrodes 220, 220', a phase of the drive voltage provided to the inner electrode 220' may be about ninety degrees (90°) out of phase with the drive voltage provided to the outer electrode 220. The drive voltages being 90° out of phase with one another may be employed when the inner and outer electrodes 220, 220' are configured to one of drive and sense the vibrational resonant mode in a push-pull relationship, for example. In some embodiments, the power supply 230 is further configured to provide a bias voltage to one or both of the inner and outer electrodes 220, 220' to tune the micro-shell resonator 210. The power supply 230 may be connected the interconnection circuitry in the resonator lid to provide the voltages to the respective electrodes 220, 220'.

Figure 5:
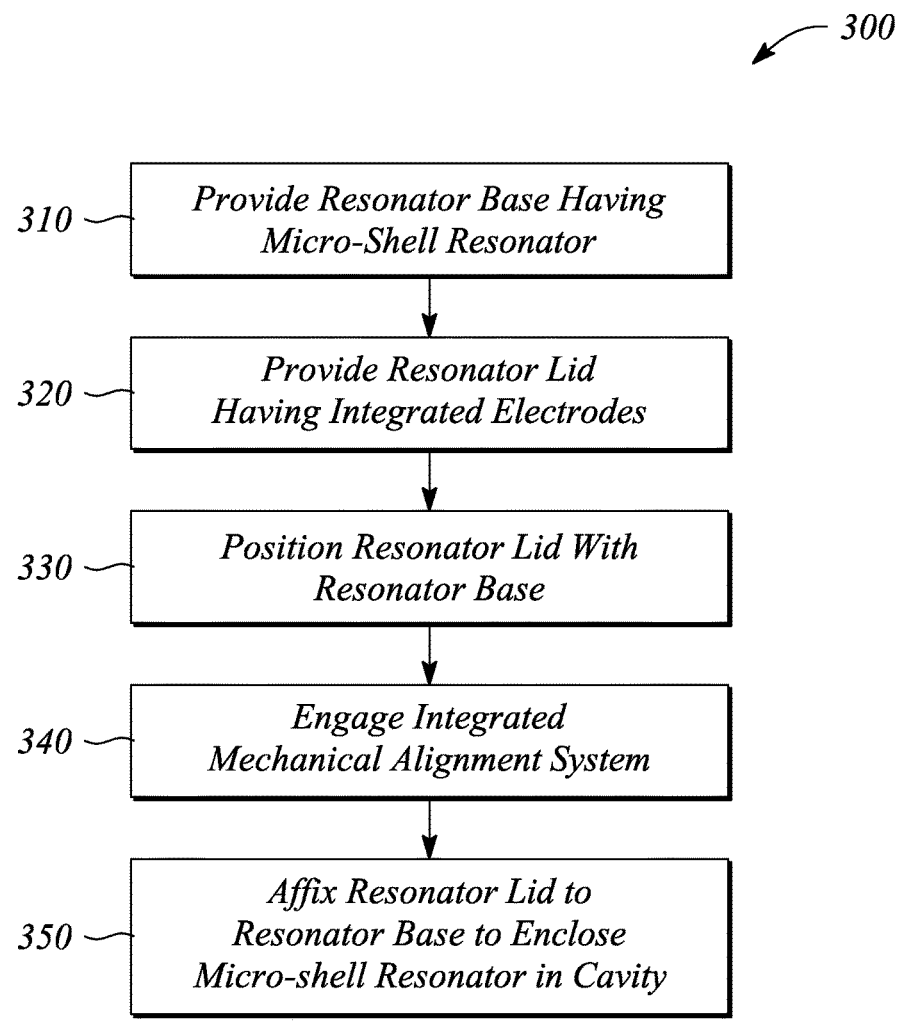
FIG. 5 illustrates a flow chart of a method of micro-resonator manufacturing in an example, according to an embodiment consistent with the present invention.

According to some embodiments of the present invention, a method of micro-resonator manufacturing is provided. FIG. 5 illustrates a flow chart of a method 300 of micro-resonator manufacturing in an example, according to an embodiment consistent with the present invention. As illustrated in FIG. 5, the method 300 of micro-resonator manufacturing comprises providing 310 a resonator base having a micro-shell resonator extending from a surface of the resonator substrate. In some embodiments, the resonator base having a micro-shell resonator is substantially similar to the micro-resonator base 110 and the MEMS resonator 130 described above with respect to the micro-resonator 100.

In some embodiments, the resonator base having the micro-shell resonator is provided 310 using SOI wafer-scale manufacturing techniques, MEMS fabrication techniques and chip-scale integration techniques. For example, a spacer layer of about 250 microns thick is added to an SOI wafer and is patterned with a cavity. The micro-shell resonator is patterned in the formed cavity from a dielectric mold of about 350 microns thick, for example. The patterned spacer layer is to provide both a stable bond area and to maintain a targeted height with respect to the micro-shell resonator height for later bonding with a resonator lid. FIG. 2A illustrates an example of the resonator base provided 310 according to the method 300 of micro-resonator manufacturing.

In some embodiments, a portion of an integral mechanical alignment system may be located within or adjacent to the cavity and fabricated at the time of the fabrication of the micro-shell resonator, for example. An example of the portions of an integral mechanical alignment system is illustrated in FIG. 2A-2B with respect to the integral mechanical alignment system 170. Moreover, a seal ring may be applied to a surface of the spacer surrounding the cavity to facilitate sealing to a resonator lid. As described above for the integral alignment system 170, a metal material of the seal ring may also be applied to the cantilevered beam at the time the seal ring is applied. In some examples, the metal material on the cantilevered beam is to stress the beam to facilitate a pre-loaded beam having an out-of-plane flex with respect to the plane of the resonator base.

The method 300 of micro-resonator manufacturing further comprises providing 320 a resonator lid having an electrode and interconnection circuitry integrated into the resonator lid. In some examples, the electrode is substantially similar to the respective lid-integrated electrode 140, 140' described above with respect to the micro-resonator 100. For example, one or both of an inner electrode and an outer electrode are fabricated to extend vertically from a surface of the lid, and be spaced apart from one another if both are present to accommodate a thickness of the resonator sidewall (e.g., opposing inner-outer electrodes of the lid-integrated electrode pair 140, 140'). Moreover, in some examples, the interconnection circuitry may be substantially similar to the interconnect 150 described above with respect to the micro-resonator 100.

In some embodiments, the resonator lid is provided 320 using one or more of SOI wafer-scale manufacturing techniques, MEMS fabrication techniques and chip-scale integration techniques on an SOI wafer. In some examples, the electrode may be formed from a semiconductor device layer of the SOI wafer. For example, the electrode is etched from a silicon device layer using a dry anisotropic silicon etch based on a Bosch process to form vertical, highly doped silicon electrode structure in the lid SOI wafer.

In some examples, an outer edge of the silicon device layer may be patterned into a lid spacer that surrounds the electrode and forms a lid cavity. In other examples, the lid spacer is not included. The lid spacer may have a height that is about the same as the vertical extent of the formed electrode, for example. In some examples, another portion of the active mechanical alignment system corresponding to the resonator base alignment system portion is also patterned and may be formed in the lid spacer, for example, adjacent to the lid cavity. The same process sequence as used for the electrode may be employed, for example. In other examples, the alignment system portions of the base and the lid may be patterned outside the cavity and the seal area near an edge of the lid SOI wafer and the base SOI wafer using wafer-scale manufacturing, MEMS techniques and chip-scale integration. The placement of the alignment system portions adjacent to outer edges of the respective SOI wafers may reduce any misalignment between the resonator base and the resonator lid caused by theta rotation of the respective base and lid wafers during subsequent assembly together. In some examples, the fabricated mechanical alignment system on the resonator base and the resonator lid is substantially the same as the active mechanical alignment system 170 described above for the micro-resonator 100.

In some examples, a backside substrate or layer of the lid SOI wafer (opposite side to the formed electrodes) may be thinned (i.e., 'wafer thinning' for example using a form of chemical mechanical polishing) to decrease an overall height of a subsequently assembled micro-resonator package and further, to create the interconnection circuitry, such as a via or feed-through, in the lid SOI wafer that may have lower loss. Wafer thinning may also facilitate electrochemical deposition of metals into the via that may enhance filled-via integrity, for example, when vacuum sealing is used for the assembled micro-resonator package.

In some examples, the via is formed through the lid SOI wafer using the same Bosch process mentioned above. Moreover, the lid SOI wafer may receive a thermal oxidation to create both a passivation and a protect layer of $SiO_2$ over the formed electrode and via before filling the via with electrically conductive material, in some examples. The via may be filled from the wafer backside with the electrically conductive material. Further, a probe or contact pad may be formed on the wafer backside surface, for example to cap and electrically access the via. In some examples, another ring of bonding or sealing material may be applied adjacent the outer edge of the lid SOI wafer on the same side as where the integrally formed electrode extend from (i.e., opposite to the backside). In some examples, the bonding ring material is located on the lid spacer and is intended to align with the seal ring on the base spacer described above. FIG. 2A further illustrates an example of the resonator lid provided 320 according to the method 300 of micro-resonator manufacturing.

The method 300 of micro-resonator manufacturing further comprises positioning 330 the resonator lid with the resonator base such that the lid-integrated electrode extends vertically toward the micro-shell resonator on the resonator base in the cavity. FIG. 2A further illustrates an example of positioning 330 the resonator lid with the resonator base according to the method 300 of micro-resonator manufacturing.

As illustrated in FIG. 5 by way of example, the method 300 of micro-resonator manufacturing may further comprise engaging 340 an integral mechanical alignment system to align the resonator base to the resonator lid. In some examples, engaging 340 the integral mechanical alignment system comprises engaging an active mechanical alignment key in an alignment notch, wherein the alignment key may be integral to one of the resonator base and the resonator lid or the respective wafer thereof and the alignment notch may be alternatively integrated in a respective other one of the resonator lid and the resonator base or the respective wafer thereof. Further, engaging 340 the integral mechanical alignment system also closely positions opposing inner and outer electrodes of a lid-integrated electrode pair relative to the micro-shell resonator.

In some examples, the mechanical alignment system facilitates substantially precise control over the positioning of the lid-integrated electrode with respect to the micro-shell resonator. For example, depending on the embodiment, one or both of the outer electrode and the inner electrode is respectively positioned spaced from and adjacent to an exterior side of the micro-shell resonator and positioned spaced from adjacent to an interior side of the micro-shell resonator with respective predetermined gap distances therebetween. Moreover, alignment accuracies of less than a few microns may substantially avoid damage to the micro-shell resonator and reduce bias offsets when gap spacing between the respective electrode and the micro-shell resonator differ from one side of the micro-shell to the other side. In contrast, wafer aligners typically have accuracies no better than ten microns to several microns. A misalignment in one direction by one micron would translate to a two-micron difference in gap spacing between the respective electrode and the micro-shell resonator sidewalls, for example. The integral active mechanical alignment system described herein may facilitate a pre-alignment accuracy of the respective lid-integrated electrode or opposing inner-outer electrode pair with the micro-shell resonator that is better than tens of microns and more like about one micron, in some examples.

In some examples, the out-of-plane flex of the alignment key pre-loaded beam may provide the engagement 340 of the mechanical alignment key in the alignment notch at a separation distance between the resonator lid and the resonator base that is greater than a combined height that the micro-shell resonator extends above the resonator base surface and that the respective inner and outer electrodes extend from the surface of the lid to avoid contact between the electrodes and the micro-shell resonator. In particular, the engagement 340 and thus, a precise alignment between the resonator lid and the resonator base may be achieved during assembly before the respective electrodes are precisely aligned with the micro-shell resonator, according to some embodiments. As such, engaging 340 the mechanical alignment key in the alignment notch may prevent damage to one or both of the micro-shell resonator and the electrodes during assembly.

The method 300 of micro-resonator manufacturing illustrated in FIG. 5 further comprises affixing 350 together the positioned resonator lid and resonator base to enclose the micro-shell resonator in a resonator cavity formed by the resonator lid and base. In some embodiments, the positioned resonator lid and resonator base are aligned by engaging 340 the integral mechanical alignment system, as described herein, before the resonator lid and base are affixed 350 together. In some embodiments, affixing 350 the resonator lid and the resonator base together may comprise forming a hermetic seal to support vacuum encapsulation of the micro-shell resonator within the resonator cavity. The seal may be formed by a eutectic bond, for example, wherein the applied seal ring is a eutectic alloy material. In some examples, wafer bonding is used to affix 350 the resonator lid and base together. In some embodiments, affixing 350 the resonator lid and the resonator base together includes bonding together the seal or bonding ring on the spacers on one or both of the resonator lid and the resonator base, for example. In some embodiments, the spacers further facilitate formation of the resonator cavity that houses the micro-shell resonator. FIG. 2B illustrates an example of the affixed resonator lid and resonator base of the micro-resonator manufactured according to the method 300, for example. The lid-integrated electrodes are aligned with the micro-shell resonator in the resonator cavity by the method 300 herein in a configuration to perform one or more of driving, sensing and tuning the vibrational resonant mode of the micro-shell resonator, for example.

Thus, there have been described examples of a micro-resonator, a micro-shell resonator system and a method of manufacturing a micro-resonator that provide a MEMS resonator enclosed in a resonator cavity between a resonator lid having a vertically configured, integrated electrode and a resonator base. It should be understood that the above-described examples are merely illustrative of some of the many specific examples and embodiments that represent the principles consistent with the principles described herein. Clearly, those skilled in the art can readily devise numerous other arrangements without departing from the scope consistent with the principles described herein as defined by the following claims.

What is claimed is:

1. A micro-resonator having a lid-integrated electrode comprising:
   a resonator base;
   a resonator lid attached to the resonator base to provide an enclosed resonator cavity;
   a microelectromechanical systems (MEMS) resonator supported by and extending from a surface of the resonator base toward the resonator lid within the resonator cavity; and
   an electrode integrated into the resonator lid, the lid-integrated electrode extending vertically from a surface of the resonator lid into the resonator cavity toward the resonator base and spaced from a sidewall of the resonator cavity,
   wherein the lid-integrated electrode is positioned adjacent to and spaced from a vertical side of the MEMS resonator, the lid-integrated electrode being configured to one or more of drive, sense and tune a mechanical movement of the MEMS resonator.

2. The micro-resonator of claim 1, wherein the MEMS resonator comprises a micro-shell resonator having an open end opposite an end supported by the resonator base, the vertical side of the MEMS resonator being one of an exterior side and an interior side adjacent the open end of the micro-shell resonator.

3. The micro-resonator of claim 2, further comprising another electrode integrated into the lid, the other lid-integrated electrode vertically extending from the lid surface into the resonator cavity toward the resonator base, the other lid-integrated electrode being positioned adjacent to and spaced from the vertical side of the micro-shell resonator opposite the lid-integrated electrode, wherein the lid-integrated electrodes form an inner-outer electrode pair configured to one or both of drive and sense the MEMS resonator movement in a push-pull relationship.

4. The micro-resonator of claim 2, wherein the micro-shell resonator comprises a dielectric micro-shell resonator having a shape that is substantially cylindrical.

5. The micro-resonator of claim 1, wherein the lid-integrated electrode is an electric gradient force electrode configured to provide an electric gradient to drive the MEMS resonator using dielectric forces.

6. The micro-resonator of claim 1, further comprising a spacer having a seal ring between the resonator lid and the resonator base, wherein the resonator cavity is configured to be hermetically sealed at an interface between the spacer seal ring and one or both of the resonator lid and the resonator base.

7. The micro-resonator of claim 6, wherein the hermetically sealed resonator cavity is configured to provide vacuum encapsulation of the MEMS resonator to facilitate the mechanical movement associated with a resonance mode of the MEMS resonator.

8. The micro-resonator of claim 1, further comprising a mechanical alignment system integral to and configured to provide active mechanical alignment between the resonator base and the resonator lid, wherein the active mechanical alignment is configured to establish and maintain the spaced from adjacent position of the lid-integrated electrode with respect to the vertical side of the MEMS resonator.

9. The micro-resonator of claim 8, wherein the integral mechanical alignment system comprises an alignment key on a pre-loaded beam integral with one of the resonator base and the resonator lid and a corresponding alignment notch integral with a respective other of the resonator base and the resonator lid, the pre-loaded beam having an out-of-plane flex relative to a plane of the resonator lid or the resonator base to facilitate engagement of the alignment key with the alignment notch, the active mechanical alignment between the resonator base and the resonator lid comprising both the engagement of the alignment key with the alignment notch and the pre-loaded beam flexed into the plane of the resonator base.

10. A micro-shell resonator system comprising:
a micro-shell resonator affixed to a substrate within a resonator cavity, the micro-shell resonator being configured to exhibit a vibrational resonant mode; and
an electrode integral to and extending vertically from a lid into the resonator cavity adjacent to and spaced from a sidewall of the micro-shell resonator, wherein the lid-integrated electrode is configured to one or more of drive, sense and tune the vibrational resonant mode of the micro-shell resonator.

11. The micro-shell resonator system of claim 10, wherein the lid-integrated electrode comprises both an outer electrode exterior to the micro-shell resonator sidewall and an opposing inner electrode positioned interior to the micro-shell resonator sidewall, in combination the outer and inner electrodes are configured to one or both of drive and sense the vibrational resonant mode in a push-pull arrangement.

12. The micro-shell resonator system of claim 11, further comprising a power supply configured to provide a drive voltage to the outer and inner electrodes, the push-pull arrangement comprising a phase of the drive voltage provided to the inner electrode being about ninety degrees out of phase with the drive voltage provided to the outer electrode.

13. The micro-shell resonator system of claim 10, wherein the micro-shell resonator comprises a dielectric micro-shell resonator, the lid-integrated electrode being configured to one or both of drive and sense the vibrational resonant mode using an electric gradient force.

14. The micro-shell resonator system of claim 10, further comprising a spacer between the lid and the substrate, the spacer having a bonding layer to provide a seal between the spacer and one or both of the lid and the substrate, wherein the seal facilitates maintaining a vacuum within the resonator cavity.

15. The micro-shell resonator system of claim 10, wherein the micro-shell resonator comprise a dielectric cylinder having a closed first end and an open second end, the micro-shell resonator being attached to the resonator base at the closed end, the lid-integrated electrode extending into an interior of the micro-shell resonator at the open end.

16. The micro-shell resonator system of claim 10, further comprising a mechanical alignment system integral to the substrate and the lid, the integral mechanical alignment system being configured to establish the sidewall-adjacent position of the lid-integrated electrode with respect to micro-shell resonator.

17. The micro-shell resonator system of claim 16, wherein the integral mechanical alignment system comprises an alignment key on a pre-loaded beam integral with one of the substrate and the lid and a corresponding alignment notch integral with a respective other of the substrate and the lid, the pre-loaded beam having an out-of-plane flex relative to a plane of one or both of the substrate and the lid, wherein the alignment key is engaged with the alignment notch and the pre-loaded beam has a substantially parallel flex to the plane of one or both of the substrate and the lid.

18. A method of micro-resonator manufacturing, the method comprising:
providing a resonator base having a micro-shell resonator that extends from a surface of the resonator base;
providing a resonator lid having electrodes integral with and extending vertically from a surface of the resonator lid;
positioning the resonator lid with the resonator base to have the surface of the resonator lid facing the surface of the resonator base; and
affixing together the positioned resonator lid and resonator base to enclose the micro-shell resonator in a resonator cavity formed by the resonator lid and base.

19. The method of micro-resonator manufacturing of claim 18, wherein the micro-shell resonator comprises a dielectric cylinder having a closed end adjacent to the resonator base surface and an opposite open end, and wherein the lid-integrated electrodes comprise an outer electrode and an inner electrode with respect to the exterior and interior sides of the micro-shell resonator, the lid-integrated electrodes being configured to perform one or both of driving and sensing the micro-shell resonator according to an electric gradient force.

20. The method of micro-resonator manufacturing of claim 18, wherein affixing together the positioned resonator lid and resonator base comprises forming a hermetic seal to support vacuum encapsulation of the micro-shell resonator within the resonator cavity.

21. The method of micro-resonator fabrication of claim 18, further comprising:
engaging an integral mechanical alignment system to align together the positioned resonator lid and resonator base before affixing together, wherein aligning together comprises positioning the lid-integrated electrodes spaced from and adjacent to one or both of an exterior side of the micro-shell resonator and an interior side of the micro-shell resonator.

22. The method of micro-resonator fabrication of claim 21, wherein the integral mechanical alignment system comprises an alignment key on a pre-loaded beam integral with one of the resonator base and the resonator lid and a corresponding alignment notch integral with a respective other of the resonator base and the resonator lid, the pre-loaded beam having an out-of-plane flex relative to a plane of one or both the resonator lid and the resonator base, and wherein engaging the integral mechanical alignment system comprises:
using the out-of-plane flex of the pre-loaded beam to engage the alignment key in the alignment notch to align together the resonator lid and base; and
flexing the pre-loaded beam into the plane of the resonator lid or base to facilitate the positioning of the lid-integrated electrodes relative to the micro-shell resonator.

* * * * *